United States Patent
Nguyen et al.

(10) Patent No.: US 8,652,887 B2
(45) Date of Patent: Feb. 18, 2014

(54) MULTI-LAYER STRUCTURES AND PROCESS FOR FABRICATING SEMICONDUCTOR DEVICES

(75) Inventors: Bich-Yen Nguyen, Austin, TX (US); Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 231 days.

(21) Appl. No.: 13/416,813

(22) Filed: Mar. 9, 2012

(65) Prior Publication Data

US 2012/0231606 A1 Sep. 13, 2012

(30) Foreign Application Priority Data

Mar. 11, 2011 (EP) .................................. 11290124

(51) Int. Cl.
*H01L 21/00* (2006.01)
*H01L 21/84* (2006.01)

(52) U.S. Cl.
USPC ........... 438/153; 438/149; 438/151; 438/152; 438/154; 438/199; 438/405; 438/423

(58) Field of Classification Search
USPC ................... 438/149, 151–154, 199, 405, 423
See application file for complete search history.

(56) References Cited

U.S. PATENT DOCUMENTS

| | | | | |
|---|---|---|---|---|
| 5,463,238 A | * | 10/1995 | Takahashi et al. | ............. 257/351 |
| 6,300,218 B1 | * | 10/2001 | Cohen et al. | .................. 438/423 |
| 6,664,146 B1 | | 12/2003 | Yu | .................................. 438/149 |
| 2003/0203546 A1 | * | 10/2003 | Burbach et al. | ............... 438/151 |
| 2006/0022270 A1 | * | 2/2006 | Boyd et al. | ..................... 257/351 |
| 2006/0157706 A1 | | 7/2006 | Zhu et al. | ........................... 257/66 |
| 2007/0196988 A1 | * | 8/2007 | Shroff et al. | .................. 438/299 |
| 2007/0262361 A1 | | 11/2007 | Zhu et al. | ....................... 257/255 |
| 2008/0102601 A1 | | 5/2008 | Bourdelle et al. | ............ 438/458 |
| 2008/0296634 A1 | | 12/2008 | Zhu et al. | ....................... 257/255 |
| 2010/0035390 A1 | * | 2/2010 | Ding et al. | ..................... 438/152 |
| 2011/0260233 A1 | * | 10/2011 | Nguyen et al. | ................. 257/316 |

FOREIGN PATENT DOCUMENTS

| | | |
|---|---|---|
| FR | 2 907 966 A1 | 5/2008 |
| FR | 2 937 794 A1 | 4/2010 |
| JP | 05-243510 A | 9/1993 |
| JP | 2006/049725 | 2/2006 |
| WO | WO 2010/106101 A1 | 9/2010 |

OTHER PUBLICATIONS

European Search Report, EP 11290124.4, mailed May 19, 2011.

* cited by examiner

*Primary Examiner* — Bac Au
(74) *Attorney, Agent, or Firm* — Winston & Strawn LLP

(57) ABSTRACT

The present invention relates to a method for providing a Silicon-On-Insulator (SOI) stack that includes a substrate layer, a first oxide layer on the substrate layer and a silicon layer on the first oxide layer (BOX layer). The method includes providing at least one first region of the SOI stack wherein the silicon layer is thinned by thermally oxidizing a part of the silicon layer and providing at least one second region of the SOI stack wherein the first oxide layer (BOX layer) is thinned by annealing.

20 Claims, 6 Drawing Sheets

MULTI-LAYER STRUCTURES AND PROCESS FOR FABRICATING SEMICONDUCTOR DEVICES

FIELD OF INVENTION

The present invention relates to the manufacture of an intermediate semiconductor device comprising multiple semiconductor and oxide layers of different thicknesses.

BACKGROUND OF THE INVENTION

Silicon-On-Insulator (SOI) semiconductor devices are of increasing interest in present and future semiconductor manufacturing, for example, in the context of the Complementary Metal Oxide Semiconductor (CMOS) technology. The buried $SiO_2$ (BOX) layer of the SOI structure is conventionally formed by oxygen ion implantation beneath the surface of a silicon wafer followed by an anneal process at typical anneal temperatures of some 1300° C. to 1400° C. In some applications there is a need for providing a patterned BOX structure. Usually, ion implantation is facilitated by a correspondingly patterned implantation mask in order to obtained such patterned BOX structures.

The manufacture of such structures is problematic. First of all, defects form at a relatively high density at the mask edge regions. Also, in order to obtain BOX structures with two or more BOX thicknesses, a second implant using a second complementary implantation mask or more additional implantation processes facilitated by a number of complementary implantation masks are needed, thereby significantly increasing the number of processing steps of the overall manufacture. Misalignment of different BOX layers of different thicknesses formed by ion implantation proves to be a further problem affecting the performance of eventually finished semiconductor devices based on SOI structures.

Thus, despite recent engineering progresses, there is still a need for providing methods for the formation of SOI structures comprising multiple Si and/or BOX layers of different thicknesses that reliably allows for tuning the thicknesses of the layers under questions. The present invention now satisfies this need.

SUMMARY OF THE INVENTION

The present invention now provides a method for the manufacture of a multilayer semiconductor structure comprising multiple semiconductor and oxide layers of different thicknesses. The inventive method comprises the following steps:

providing a Silicon-On-Insulator (SOI) stack comprising a substrate layer, a first oxide layer on the substrate layer and a silicon layer on the first oxide layer (BOX layer);

providing at least one first region of the SOI stack wherein the silicon layer is thinned by thermally oxidizing part of the silicon layer; and providing at least one second region of the SOI stack wherein the first oxide layer (BOX layer) is thinned by annealing to thus provide a multilayer semiconductor structure having semiconductor and oxide layers of different thicknesses on different regions of the substrate to facilitate the addition of electronic devices by providing more headroom for the formation of such devices on the SOI stack. Thus, the SOI stack is subjected to oxidizing and anneal processes to thereby partially dissolving at least a part of the first oxide layer (silicon oxide layer) and the silicon layer in selected regions of the substrate.

According to an embodiment of the invention SOI stacks comprising silicon layers as well as oxide layers (BOX layers) of different thicknesses can be provided. The thicknesses can be readily fine-tuned by appropriately controlled thermal oxidation and anneal. In particular, an SOI stack can be provided that includes a silicon layer with three or more regions of different thicknesses and/or including a first oxide layer with three or more regions of different thicknesses.

The first and second regions may at least partially overlap each other. Thus, a particular portion of the SOI stack may comprise both a thinned silicon layer and a thinned BOX layer.

Different combinations of relatively thin or thick BOX layers and silicon layers are appropriate for different electronic devices. Thus, an SOI stack obtained by an example of the above-described method may comprise a thinned BOX layer and a thinned silicon layer as it is advantageous for (short channel) Fully Depleted SOI (FDSOI) devices. Such an FDSOI device may comprise, for example, a doped back plate below the BOX layer that may be realized in form of a static backgate or dynamic backgate. Such FDSOI devices may, particularly, be provided for core devices for DRAMs, for example, sense amplifiers, WL drivers and decoders, for embedded DRAMs, flash devices, SRAMs, embedded SRAMs, MRAMs, FeRAMs, ReRAMs, Floating Body Cells (FBCs), Field-Programmable Gate Arrays (FPGAs), System on Chips (SoCs) and all logic applications where stability of the threshold voltage is crucial and backgate tuning is desirable, especially, for low power mobile applications.

A Floating Body memory or non-volatile memory device, on the other hand, may advantageously formed on a part of an SOI stack comprising both a thinned BOX layer and a non-thinned relatively thick silicon layer in order to comprise a relatively thin tunneling dielectric at low voltage and a relatively thick silicon layer for the floating gate.

SOI stacks with relatively thick BOX and silicon layers are preferable for long channels SOI devices with high voltage and/or high power performance, for example, line drivers, I/O devices with high supply voltage of more than 1.5 V, etc. In the context of high (power) performance logic devices a relatively thick BOX layer is helpful in reducing the coupling capacitance with the back gate when provided.

In all these applications, as noted, the inventive manufacturing process exhibits an advantage over the prior art in that more headroom for the formation of devices on the provided SOI stacks on the same chip can be provided.

For instance, a flash memory device can be formed on a part of an SOI stack comprising an thinned BOX layer whereas an FBC can be formed on the same SOI stack in a region wherein the BOX layer has not been thinned.

According to another example, an FBC can be formed on a thinned BOX layer of an SOI stack and be provided with a back gate below the BOX layer. In particular, a back electrode can be implanted under the BOX layer which might be thinned down to a thickness of some nanometers.

The thermal oxidation processing can be performed in an oxygen atmosphere, in particular, comprising $O_2/H_2$ or $O_2/H_2/HCl$ or $O_2/HCL$ without or with dilution in some $N_2$ or Ar or He ambient at a temperature of 800° C. to 1050° C. Anneal can be achieved by a high-temperature anneal process, in particular, at a temperature of 900° C. to 1250° C. in an anneal ambient comprising Ar and/or $N_2$, thereby partially dissolving the part of the first oxide layer beneath the first thinned silicon layer in order to obtain a first thinned silicon oxide layer.

The steps of annealing and thermal oxidizing can be performed in the same process chamber thereby avoiding wafer transport and provision of different processing tools. In this case, the steps of annealing and thermal oxidizing are performed in a single continuous process step wherein the composition of the atmosphere in the process chamber and the temperature are modified according to anneal and oxidation conditions. Thus, intermediate semiconductor on SOI structures comprising both BOX layers of different thicknesses and active silicon layers of different thicknesses in a desired combination to meet the system on the chip requirement can be readily obtained. Depending on the actually used reaction gases it may be preferred to perform the anneal before the thermal oxidation in the same process chamber, in particular, if inert gases are used for the anneal treatment. Thereby, contamination of the treated SOI stack is not significantly enhanced with respect to processing in different process chambers.

The inventive method may further comprise providing at least one shallow trench isolation in the SOI stack after performing the anneal and/or the oxidation to define a first and a second device area. Since the shallow trench isolation is performed after the thermal treatment oxide filling the trench in order to form the shallow trench isolation is not affected by the oxidation/anneal.

The inventive method according to an example may comprise the steps of providing a second oxide layer on the silicon layer and a first mask layer on the second oxide layer;

patterning the second oxide layer and the first mask layer to expose a first part of the silicon layer; and thermally oxidizing the exposed silicon layer to form a silicon (di)oxide layer on the previously exposed silicon layer and a first thinned silicon layer.

It is noted that herein a particular part of an initial layer and a part of the initial layer resulting from thinning with respect to the particular part are referenced as different layers for clarity reasons.

Steps of the above method can be repeated. Thus, the method may also comprise the steps of providing (depositing the mask layer and patterning it accordingly) a second mask layer on a part of the silicon oxide layer formed by the thermal oxidation and thermally oxidizing a part of the first thinned silicon layer located beneath the part of the silicon oxide layer that is not covered by the second mask layer thereby providing another silicon oxide layer and a second thinned silicon layer.

Alternatively, the silicon oxide layer formed by the (first) thermal oxidation may be removed and a second mask layer may be formed on a part of the thus exposed first thinned silicon layer and a part of the first thinned silicon layer not covered by the second mask layer can be thermally oxidized in order to form the second thinned silicon layer.

By the above embodiments of the present invention structures with silicon layers serving as active layers located above a BOX layer can readily be obtained and the thicknesses of the silicon layers can be fine-tuned by appropriately controlled thermal oxidation. Co-integration of process modules from different technologies can be facilitated.

On a single chip multiple device areas for forming individual semiconductor devices, for example, FTEs, can be defined wherein the different device areas comprise active silicon layers of different thicknesses. The different device areas can be then separated from each other by Shallow Trench Isolation (STI) formed after the thermal oxidation and oxide removal processing to avoid the oxide removal in the STI region (so called Divot) resulted in higher leakage or yield loss. Thus, the above-described method may further comprise subsequently providing a shallow trench isolation between a first device area comprising the part of the silicon layer not previously exposed by the patterned second oxide layer and first mask layer and a second device area comprising the first thinned silicon layer.

In the case that two thinned silicon layers are formed the steps of providing the second mask layer on a part of the silicon oxide layer formed by the thermal oxidation and thermally oxidizing the part of the first thinned silicon layer located beneath the part of the silicon oxide layer that is not covered by the second mask layer thereby providing another silicon oxide layer and a second thinned silicon layer can be followed by providing a first shallow trench isolation, as an option, between a first device area comprising the part of the silicon layer not previously exposed by the patterned second oxide layer and first mask layer and a second device area comprising the first thinned silicon layer and providing a second shallow trench isolation between the second device area and a third device area comprising the second thinned silicon layer. Only one STI can be formed to separate all the devices after tuning the silicon and BOX thickness to meet the circuit requirement. One or multi STI is the option that can be chosen for simplifying integration or minimizing topology.

By the formation of the STI, deterioration due to damages caused by stress induced in the transition regions of the different device areas can be avoided.

According to the present invention not only the thicknesses of silicon layers above a BOX layer can be tuned but, moreover, the BOX layer thickness can be varied. The above-described method may further comprise the step of removing the silicon oxide layer from the first thinned silicon layer and subjecting the resulting structure to an high-temperature anneal process, in particular, at a temperature of 900° C. to 1250° C. in an anneal ambient comprising Ar and/or N and/or $He_2$, thereby partially dissolving the part of the first oxide layer beneath the first thinned silicon layer in order to obtain a first thinned silicon oxide layer.

Accordingly, when two thinned silicon layers are formed according to an embodiment described above the steps of providing the second mask layer on a part of the silicon oxide layer formed by the thermal oxidation and thermally oxidizing the part of the first thinned silicon layer located beneath the part of the silicon oxide layer that is not covered by the second mask layer thereby providing another silicon oxide layer and a second thinned silicon layer can be followed by removing the other silicon oxide layer from the second thinned silicon oxide layer and subjecting the resulting structure to an high-temperature anneal process, in particular, at a temperature of 900° C. to 1250° C. in an anneal ambient comprising Ar and/or $N_2$, thereby partially dissolving the part of the first oxide layer beneath the second thinned silicon layer in order to obtain a second thinned silicon oxide layer.

The high temperature anneal step to thinning down the BOX and followed by the oxidation step to thinning down the silicon layer can be performed in the same process cycle and tool.

Thus, intermediate semiconductors on SOI structures comprising both BOX layers of different thicknesses and active silicon layers of different thicknesses in a desired combination to meet the system on the chip requirement can be readily obtained.

The inventive method according to an example may comprise the steps of providing an SOI stack comprising a substrate layer, a first silicon oxide layer (BOX layer) on the substrate layer and a silicon layer on the first oxide layer;

providing a second oxide layer or a combination of oxide and silicon nitride films on the silicon layer and a mask layer on the second oxide layer;

patterning the second oxide layer and the mask layer to expose a first part of the silicon layer; and subjecting the resulting structure to an anneal process, in particular, at a temperature of 900° C. to 1250° C. in an anneal ambient comprising Ar and/or $N_2$ and/or He, thereby partially dissolving the part of the first silicon oxide layer beneath the exposed first part of the silicon layer in order to obtain a first thinned silicon oxide layer (thinned BOX layer).

The exposed first part of the silicon layer may be completely cleaned from oxide by polishing or other treatment. By the anneal processing of the part not covered by the patterned second oxide layer and mask layer partly and locally the first oxide layer is subject to dissolution and oxygen can diffuse out of the structure thereby partly turning the silicon oxide layer into silicon. Fine-tuning of the thickness of the thinned silicon oxide layer can readily be performed by appropriately controlling the high-temperature anneal processing.

Particularly, the method may further comprise the steps of:
providing a third oxide layer or combination of oxide and silicon nitride layer and another masking layer on the exposed first part of the silicon layer;

patterning the third oxide or combination of oxide/silicon nitride layer and the other mask layer to expose a second part of the silicon layer; and subjecting the resulting structure to another anneal process thereby partially dissolving the part of the first thinned silicon oxide layer beneath the exposed second part of the silicon layer in order to obtain a second thinned silicon oxide layer.

According to an embodiment the method also comprises subsequently removing the patterned second oxide layer and mask layer and subsequently providing a further oxide layer and a nitride layer over the silicon layer and providing a shallow trench isolation between a first device area comprising the part of the silicon layer that was previously covered by the patterned second oxide layer and mask layer and a second device area comprising the previously exposed first part of the silicon layer and comprising the first thinned silicon oxide layer. As previously described, damages between device areas caused by induced stresses can be avoided by the provision of the STIs.

The examples for a method for the formation of SOI structures with different BOX layers of different thicknesses may further comprise thermally oxidizing the exposed first part of the silicon layer, in particular, in an oxygen atmosphere, in particular, comprising $O_2/H_2$ or $O_2/H_2/HCl$ or $O_2/HCl$ without or with dilution in $N_2$ or Ar or He ambient at a temperature of 800° C. to 1100° C., thereby obtaining a thinned silicon layer.

The steps of high-temperature annealing and thermal oxidizing can be performed in the same process chamber in order to simplify and accelerate the overall processing by avoiding transport of the structure between different chambers and/or by avoiding the requirements of providing different processing tools. In this continuous process step, the composition of the atmosphere in the process chamber and the temperature can be modified according to anneal and oxidation conditions to prepare the regions of different thicknesses of the semiconductor and oxide layers. The procedure of masking and thermal oxidation and masking and anneal may be repeated thereby providing SOI structures comprising both multiple silicon layers of different thicknesses and multiple BOX layers of different thicknesses.

In all of the above-described examples the mask layers can be nitride layers, in particular, silicon nitride layers.

BRIEF DESCRIPTION OF THE DRAWINGS

Additional features and advantages of the present invention will be described with reference to the drawings. In the detailed description that follows, reference is made to the accompanying figures that are meant to illustrate preferred embodiments of the invention. In these figures.

DETAILED DESCRIPTION OF THE PREFERRED EMBODIMENTS

In the following description, examples of a method for the manufacture of semiconductor devices on an SOI structure according to the present invention are described with reference to FIG. 1a to FIG. 1f and FIGS. 2a to 2e. With respect to FIGS. 1a to 1f, thinning of a silicon layer of an SOI stack is described whereas FIGS. 2a to 2e illustrate thinning of a BOX layer. It has to be understood, however, that according to the present invention both the process of thinning the silicon layer and the process of thinning the BOX layer can be performed for the same SOI stack in different regions of the same. In particular, this can be performed in a region comprising a thinned silicon layer and a region comprising a thinned BOX layer that may or may not overlap each other.

Figure 1A:
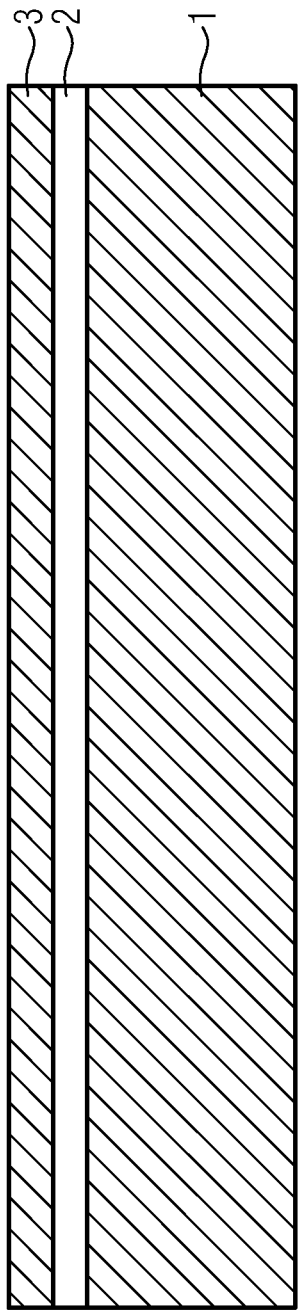
FIGS. 1a-1f illustrate an example of the inventive method for the manufacture of semiconductor devices on an SOI structure comprising active Si layers of different thicknesses.
Figure 1B:
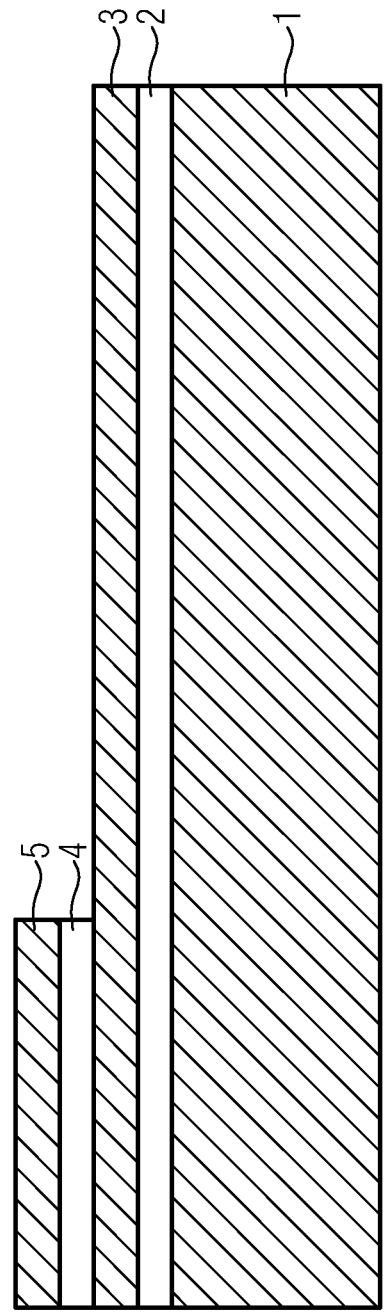
Figure 1C:
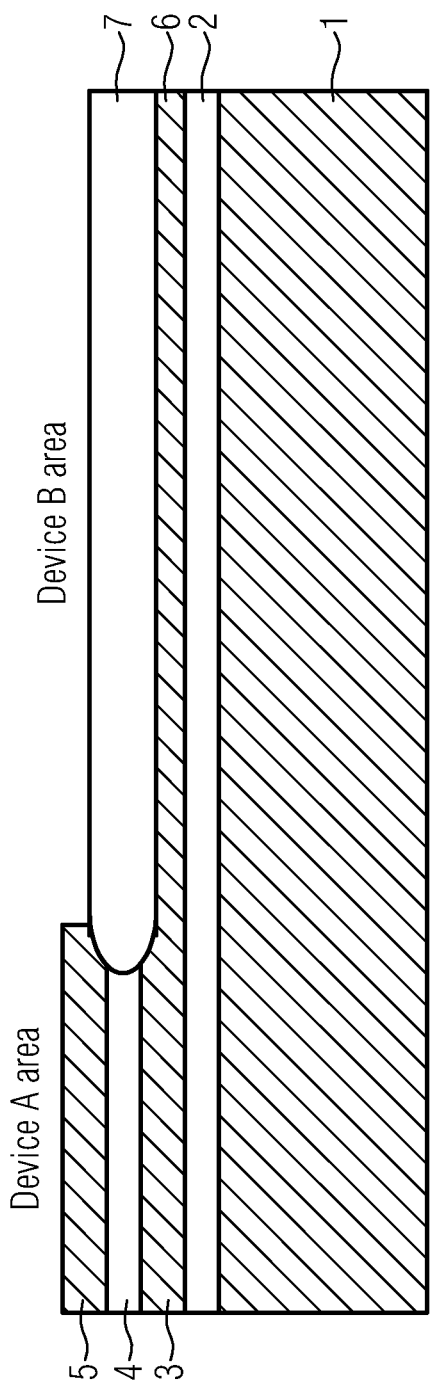
Figure 1D:
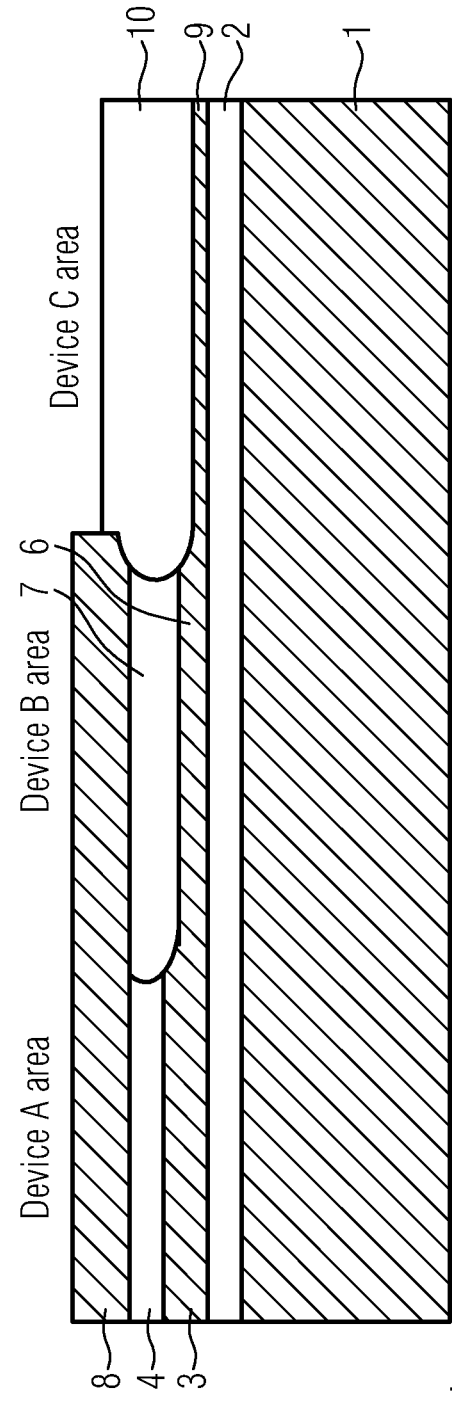
Figure 1E:
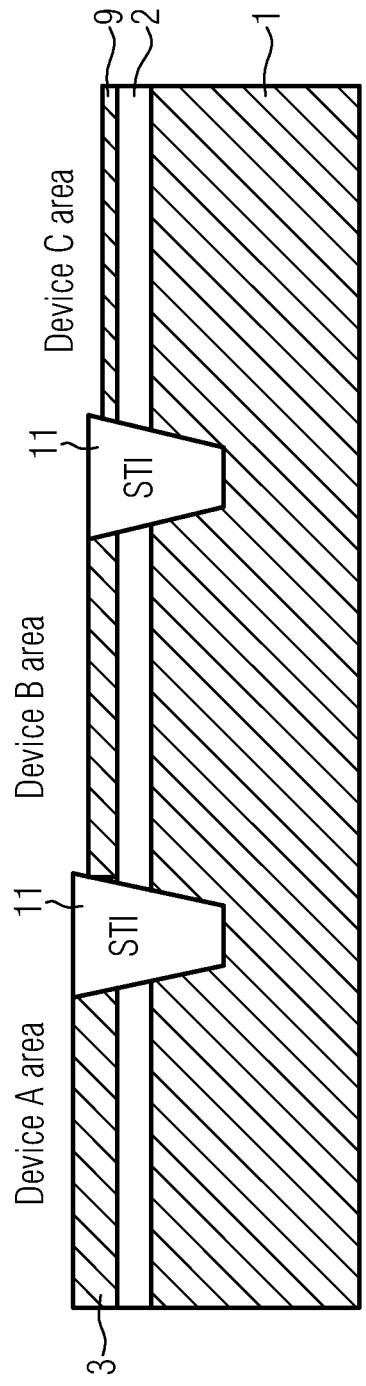

FIG. 1a shows an SOI structure comprising a base silicon substrate layer 1, an oxide layer (BOX layer) 2 and a silicon layer 3 that is intended to form the active layer of a finished semiconductor device. Instead of a silicon substrate 1, a silicon germanium or a silicon carbon substrate may be provided. Substrates of other semiconductor materials that are capable of forming oxides are also suitable. The oxide layer 2 may be formed by heating in an oxidizing atmosphere or by oxygen ion implantation as known in the art. Furthermore, the base silicon substrate layer 1 below the BOX layer 2 may be p+ or n+ doped according to the final application desired. In the shown example, FIGS. 1c, 1d and 1e show three different device areas, device area A, device area B and device area C, that are formed. The thickness of the silicon layer 3 is selected according to the thickness of an active layer desired for one of the device areas, e.g., device area A.

A thin oxide layer 4 and a silicon nitride mask layer 5 are provided by being deposited or grown on the provided SOI structure, i.e., on the silicon layer 3. Subsequently, a lithographic photoresist mask (not shown) is formed above the silicon nitride mask layer 5 and patterned. The parts of the thin oxide layer 4 and the silicon nitride mask layer 5 that are not covered by the patterned photoresist mask are etched by conventional techniques to achieve the structure shown in FIG. 1b. Then, the structure shown in FIG. 1b is subjected to thermal oxidation in an atmosphere comprising $O_2$. For example, thermal oxidation may be performed at a temperature in the range of some 800° C., to 1100° C. in an atmosphere comprising $O_2/H_2$ or $O_2/H_2/HCl$ or $O_2/HCl$ with or without dilution by $N_2$, Ar or He. An upper portion of the exposed part of the silicon layer 3 is oxidized during the oxidation processing. Thus, the silicon layer 3 is partly thinned resulting in a first thinned silicon layer 6 and partly turns into a first silicon oxide layer 7. Adjacent to the first device area (device area A) comprising the silicon layer 3 with the initial thickness, is formed a second device area (device area B) comprising the first thinned silicon layer 6 and the first silicon oxide layer 7. Note that the thinned part 6 of the initial layer 3 and the non-thinned part are numbered as two different layers for clarity as they have different thicknesses after being treated according to the present invention method.

The process of thinning the initial silicon layer 3 by oxidation can then be repeated. As illustrated in FIG. 1d, according to the shown particular example, a silicon nitride layer is formed above the first silicon oxide layer 7 and adjacent to the silicon nitride mask layer 5 thereby resulting in the combined silicon nitride mask layer 8. The combined silicon nitride mask layer 8 protects against oxidation in device areas A and B during a further thermal oxidation processing. By the further thermal oxidation processing in the unmasked device area C the exposed part of the first thinned silicon layer 6 is thinned such that it results in a second thinned silicon layer 9 formed under the second silicon oxide layer 10 that forms during the further thermal oxidation.

Thus, by appropriate masking and oxidation different device areas comprising silicon layers of different thicknesses can readily be formed on the same chip to meet specific application specifications. However, some stress/strain can be induced at the transition regions (indicated by the half-elliptic contours in FIGS. 1c and 1d) between device areas A, B and C. These strained material regions may cause damage and may give rise to deterioration of the finished semiconductor devices. For this reason, Shallow Trench Isolation (STI) shall be formed in the transition regions (e.g., with a width of some 20 to some 100 nm) as illustrated in FIG. 1e. After etching the respective trenches an oxide is 11 deposited in the trenches, for example, by chemical vapor deposition (CVD). The STI is planarized with respect to the thicknesses of the respective thicker one of the silicon layers 3, 6, 9 that are separated by the STIs. The depths and widths of the STI are adjusted taking into account dopant depth in the different device areas A, B and C in order to avoid leakage between the different doped silicon regions. This holds for both the base substrate layer 1 located below the BOX layer 2 and the silicon layers 3, 6 and 9. It is noted that the doping may be different for different device areas. The depths of the STI may be chosen in a range of some 200 nm to some 500 nm, for example.

Figure 1F:
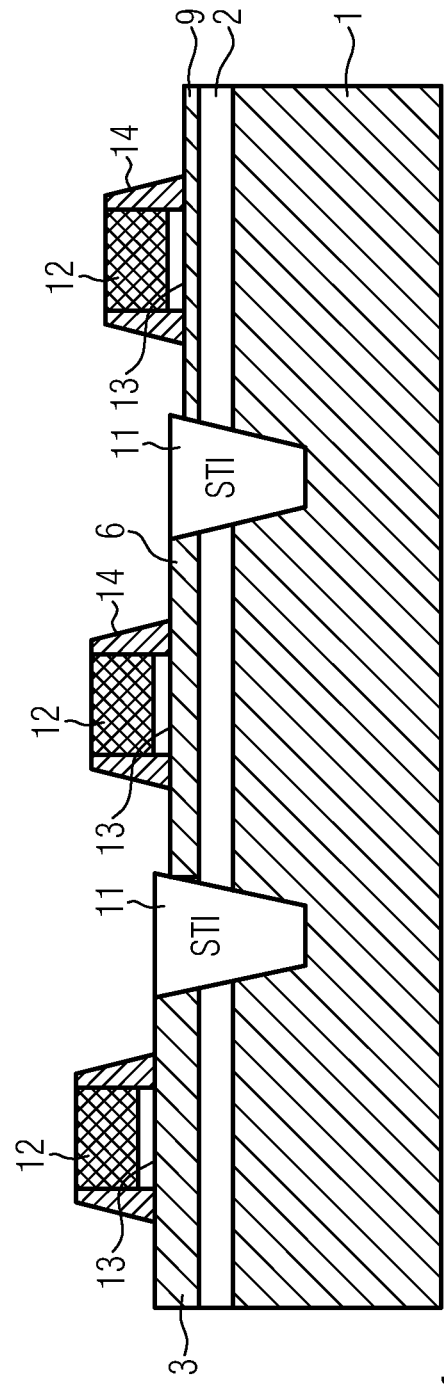

The STIs are preferably formed after the above-described thermal oxidation processing in order to avoid damaging the SOI oxides 11 that otherwise could be caused by the thermal oxidation. After that the SOI transistors are formed in the device areas A, B and C as illustrated in FIG. 1f. In the shown example, the transistors, respectively, comprise a gate electrode 12, a gate oxide 13 and sidewall spacers 14 that may facilitate the formation of source/drain extension regions. The transistor may be of different conductivity type and, accordingly, the silicon layers 3, 6 and 9 comprising the channel regions of the transistors may be undoped or doped by dopants of different conductivity types. Moreover, adjacent to the sidewall spacers 14 (e.g., in accordingly formed source/drain regions) metal alloys may be formed in the silicon layers 3, 6 and/or 9 in order to enhance the performance of the transistors. Fine tuning of the compressive or tensile stress induced in the channel regions by such metal alloys is facilitated by the different thicknesses of the (active) silicon layers 3, 6 and 9.

Figure 2A:
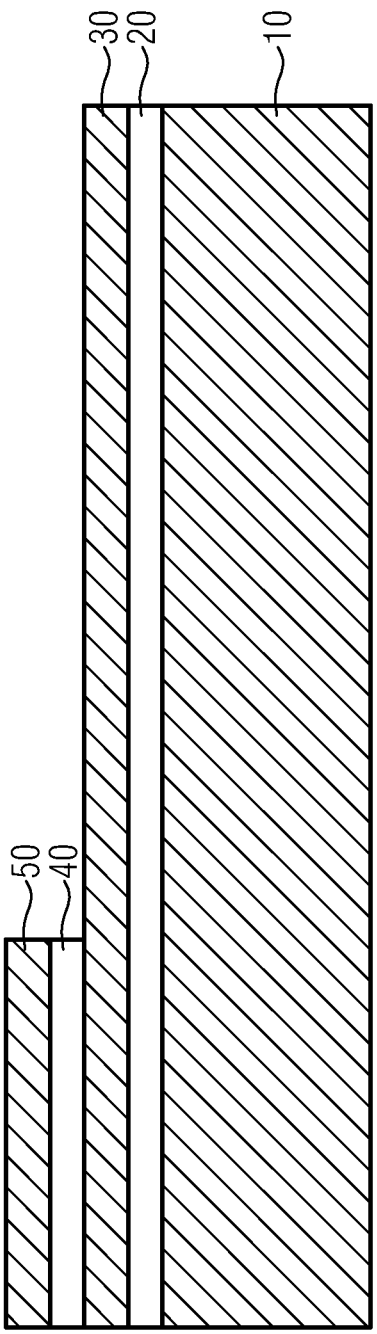
FIGS. 2a-2e illustrate another example of the present invention wherein an intermediate semiconductor device on an SOI structure comprising BOX layers of different thicknesses is illustrated.
Figure 2B:
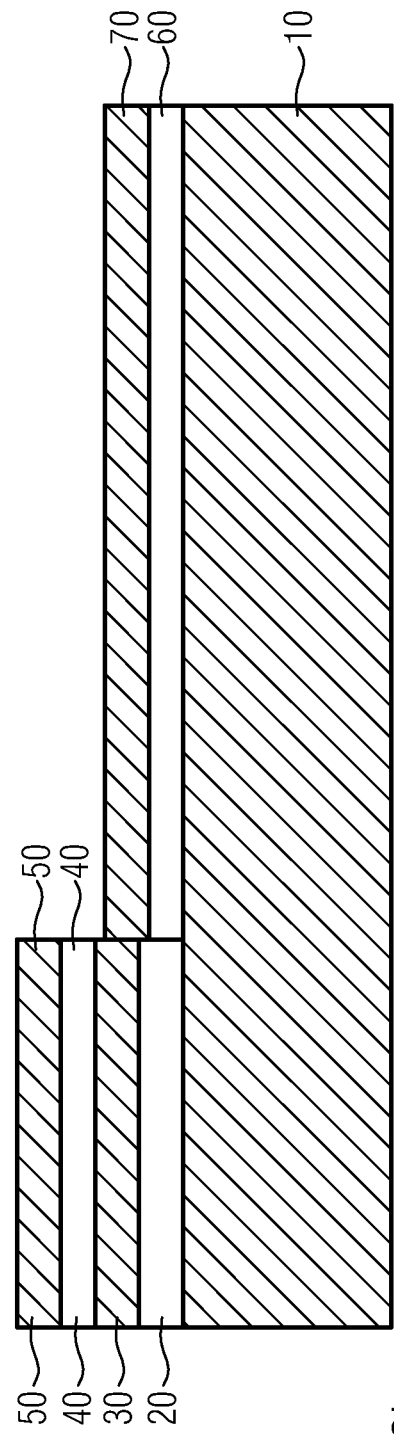

Another example of the present invention is described with reference to FIGS. 2a to 2e. As it is described with reference to FIG. 1b, an SOI structure comprising a base substrate layer 10, a BOX layer 20 consisting of silicon dioxide and a silicon layer 30 with a patterned thin oxide layer 40 and silicon nitride mask layer 50 formed above is obtained as a starting point for the further procedure. The exposed surface of the silicon layer 30 may be treated, for example, by polishing, to remove any oxide components. Subsequently, the structure shown in FIG. 2a is subjected to a high temperature anneal at a temperature in the range of 900° C. to 1250° C. in an ambient comprising Ar or $N_2$ or He in order to cause some partial dissolution of the silicon dioxide BOX layer 20. Oxygen from the BOX layer 20 is dissolved and out-diffusion of the dissolved oxygen results in a thinned BOX layer 60 covered by silicon layer 70 as it is illustrated in FIG. 2b (note the resulting step between silicon layer 20 and silicon layer 70).

Figure 2C:
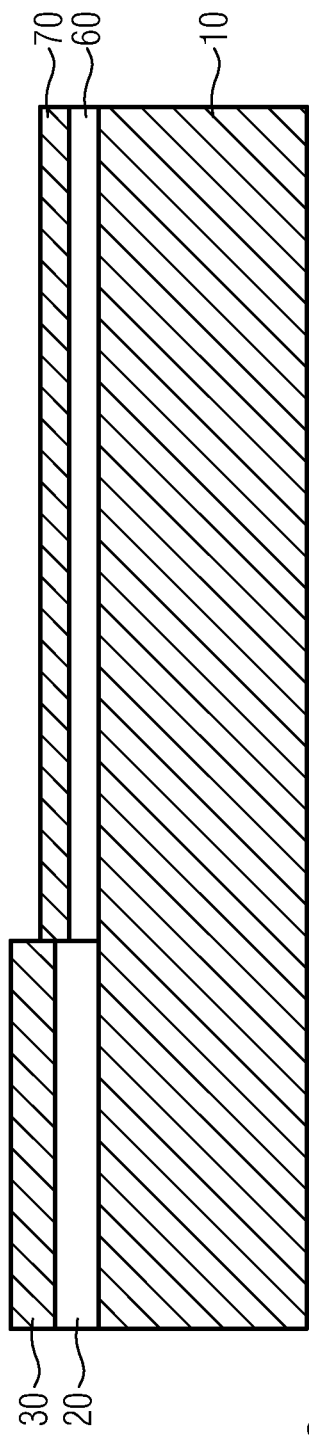
Figure 2D:
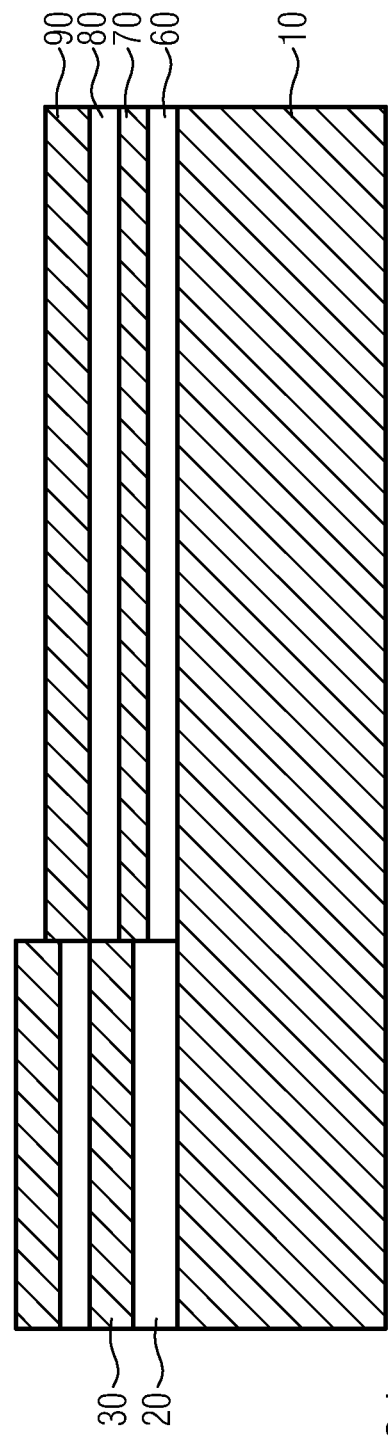

According to the present example and as shown in FIG. 2c and FIG. 2d the masking oxide and nitride layer 40 and 50 are removed and another oxide layer 80 and another nitride layer 90 are formed above silicon layers 30 and 70 to facilitate the formation of an SOI thereby defining a first device area comprising silicon layer 30 and BOX layer 20 and a second device area comprising silicon layer 70 and BOX layer 60, respectively. Optionally, an antireflection mask layer may (ARC layer) be formed above the nitride layer 90 to facilitate the lithography processing.

Figure 2E:
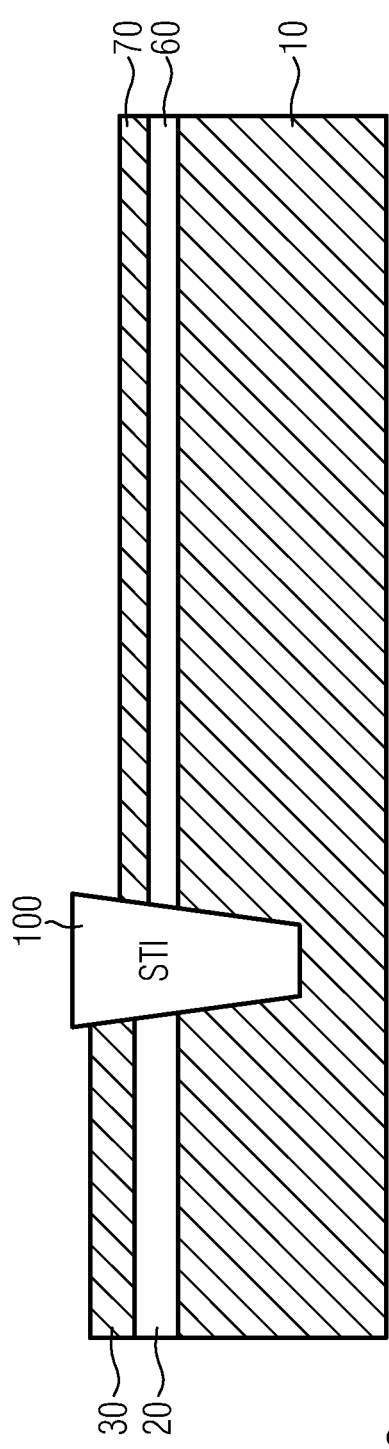

FIG. 2e shows the intermediate semiconductor device in a further processing stage. The active regions and the STI region may be defined for the structure shown in FIG. 2d by photolithography using a photoresist. The masking oxide layer 80 and nitride layer 90 (and the ARC layer, if present) are etched, the photoresist is removed and a trench is formed for the STI by etching. Then, the trench is filled by an oxide 100. After planarization of the oxide by using chemical mechanical polish, the remaining masking oxide layer 80 and nitride layer 90 are removed from the active regions separated by the STI. Silicon layers 30 and 70 can serve as active layers for field-effect transistors (FETs) formed on the SOI structure shown in FIG. 2e.

Whereas in the above-described example, one anneal processing is carried out to achieve a thinned BOX layer 60, the steps of masking parts of the upper silicon layer and annealing thereby thinning parts of a BOX layer covered by the exposed part of the upper layer can be repeated as desired. For instance, in the above example an additional oxide layer and an additional nitride mask layer may be formed partly on the silicon layer 70 and the resulting structure may be subjected to high-temperature anneal. This second high-temperature anneal would result in a further thinning of thinned BOX layer 60 in parts not covered by the additional oxide and nitride mask layers. Thus, three different device areas comprising BOX layers of different thicknesses would result. It should be noted that the different BOX layers of different thicknesses obtained according to the example of the present invention are perfectly aligned.

As already mentioned the exemplary methods described with reference to FIGS. 1a to 1f, on the hand, and with reference to FIGS. 2a to 2e, on the other hand, can be combined in order to manufacture semiconductor devices with both different BOX layers of different thicknesses and different active silicon layers with different thicknesses. In particular, the process of thinning the silicon layer (see FIGS. 1a to 1c and the process of thinning the BOX layer (see FIGS. 2a to 2e) may advantageously be performed in the same process chamber with varying process parameters (chemical composition of the reaction gases, temperature, pressure, etc.) appropriate for the thermal oxidation and anneal, respectively. Both processes can be performed in the course of one single continuous processing in the same process chamber.

For instance, consider starting from the structure shown in FIG. 1c comprising device area A comprising silicon layer 3 and device area B comprising silicon layer 6 having a thickness lower than that of silicon layer 3. After complete removal of oxide layer 7 previously formed by thermal oxidation high-temperature anneal can be performed in order to thin the BOX layer 2 beneath the thinned silicon layer 6 as it is described with reference to FIG. 2b. Similarly, the structure shown in FIG. 1d can be subjected to high-temperature anneal after complete removal of oxide layer 10 thereby obtaining a BOX layer in device area C that is thinned with respect to BOX layer 2 comprised in device areas A and B.

Furthermore, a manufacture processing sequence may comprise the principal step of high-temperature anneal for thinning a BOX layer followed by the principal step of thermal oxidation for thinning an active silicon layer as will described with reference to FIG. 3.

The starting point is the structure comprising a BOX layer 20 covered by silicon layer 30, thin oxide layer 40 and silicon nitride mask layer 50 as well as BOX layer 60 that is thinned with respect to BOX layer 20 and covered by silicon layer 70 as shown in FIG. 2b. Silicon layer 70 can now be thinned with respect to silicon layer 30 by thermal oxidation at a temperature of some 800° C. in an ambient $O_2/H_2$ or $O_2/H_2/HCl$ or $O_2/HCl$ without or with dilution in a $N_2$ or Ar or He ambient, for example. After the thermal oxidation the thinned layer 70' is covered by a silicon oxide layer that is removed by etching and/or polishing. Similarly, oxide layer 40 and nitride layer 50 are removed to obtain an intermediate semiconductor device that can be used for forming transistors as it is illustrated in FIG. 1f or other CMOS devices.

Figure 3:
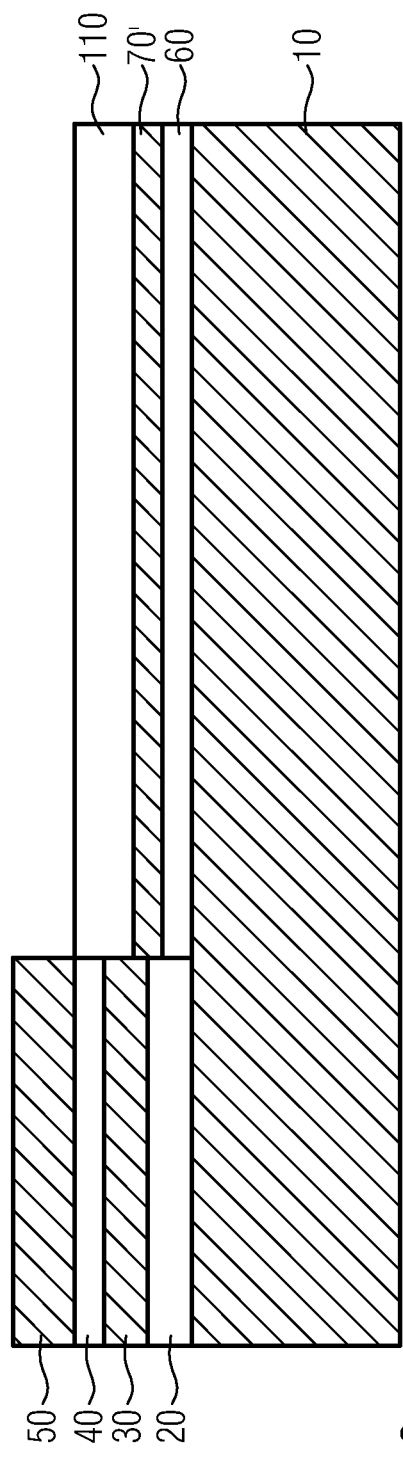
FIG. 3 illustrates another example of the present invention wherein thermal oxidation following high-temperature anneal are subsequently carried out to obtain device areas comprising BOX layers and active layers of different thicknesses.

It should be noted that STIs can preferably be formed in the structure shown in FIG. 3 after the thinning processes, i.e. after completion of the thermal oxidation and the anneal. Similarly, the STIs shown in FIGS. 1e and 2e, respectively, may be formed after completion of both the thermal oxidation and the anneal.

All previously discussed embodiments are not intended as limitations but serve as examples illustrating features and advantages of the invention. It is to be understood that some or all of the above described features can also be combined in different ways.

What is claimed is:

1. A method for the manufacture of a multilayer semiconductor structure comprising multiple semiconductor and oxide layers of different thicknesses, which comprises the following steps:
   providing a Silicon-On-Insulator (SOI) stack comprising a substrate layer, a first oxide layer on the substrate layer and a silicon layer on the first oxide layer (BOX layer);
   providing at least one first region of the SOI stack wherein the silicon layer is thinned by thermally oxidizing part of the silicon layer; and
   providing at least one second region of the SOI stack wherein the first oxide layer (BOX layer) is thinned by annealing to thus provide a multilayer semiconductor structure having semiconductor and oxide layers of different thicknesses on different regions of the substrate to facilitate the addition of electronic devices by providing more headroom for the formation of such devices on the SOI stack.

2. The method according to claim 1, wherein the steps of annealing and thermal oxidizing are performed in the same process chamber thereby avoiding transport of the structure or avoiding requirements for different processing tools.

3. The method according to claim 2, wherein the annealing and thermal oxidizing are performed in a single continuous process step wherein the composition of the atmosphere in the process chamber and the temperature are modified according to anneal and oxidation conditions to prepare the regions of different thicknesses of the semiconductor and oxide layers.

4. The method according to claim 1, wherein the at least one first region and the at least one second region at least partially overlap each other.

5. The method according to claim 1, which further comprises providing at least one shallow trench isolation in the SOI stack to define a first and a second device area.

6. The method according to claim 5, wherein the providing of the at least one shallow trench isolation occurs after the annealing.

7. The method according to claim 5, wherein the providing of the at least one shallow trench isolation occurs after the thermal oxidizing.

8. The method according to claim 5, wherein the providing of the at least one shallow trench isolation occurs after both the annealing and the thermal oxidizing.

9. The method according to claim 1, which further comprises:
   providing a second oxide layer on the silicon layer and a first mask layer on the second oxide layer;
   patterning the second oxide layer and the first mask layer to expose a first part of the silicon layer; and
   thermally oxidizing the exposed first part of the silicon layer to form a silicon oxide layer on the previously exposed silicon layer and a first thinned silicon layer.

10. The method according to claim 9, which further comprises providing a second mask layer on part of the silicon oxide layer and thermally oxidizing part of the first thinned silicon layer located beneath the part of the silicon oxide layer that is not covered by the second mask layer thereby providing another silicon oxide layer and a second thinned silicon layer.

11. The method according to claim 9, which further comprises subsequently providing a shallow trench isolation between a first device area comprising the part of the silicon layer not previously exposed by the patterned second oxide layer and first mask layer and a second device area comprising the first thinned silicon layer.

12. The method according to claim 9, which further comprises subsequently providing a first shallow trench isolation between a first device area comprising the part of the silicon layer not previously exposed by the patterned second oxide layer and first mask layer and a second device area comprising the first thinned silicon layer, and providing a second shallow trench isolation between the second device area and a third device area comprising the second thinned silicon layer.

13. The method according to claim 9, which further comprises removing the silicon oxide layer from the first thinned silicon layer and subjecting the resulting structure to an anneal process to thereby partially dissolve the part of the first oxide layer beneath the first thinned silicon layer in order to obtain a first thinned silicon oxide layer.

14. The method according to claim 13, wherein the anneal process is conducted as an anneal ambient comprising Ar or $N_2$.

15. The method according to claim 10, which further comprises removing the other silicon oxide layer from the second thinned silicon oxide layer and subjecting the resulting structure to an anneal process, thereby partially dissolving the part of the first oxide layer beneath the second thinned silicon layer in order to obtain the second thinned silicon oxide layer.

16. The method according to claim 15, wherein the anneal process is conducted as an anneal ambient comprising Ar or $N_2$.

17. The method according to claim 15, which further comprises thermally oxidizing the exposed first part of the silicon layer at a temperature of 800° C. to 1100° C., thereby obtaining a thinned silicon layer, wherein the oxidizing is conducted in an oxygen atmosphere that optionally includes $H_2$, HCl or $H_2$/HCl and with or without dilution by $N_2$, Ar or He.

18. The method according to claim 1, which further comprises:
  providing a second oxide layer on the silicon layer and a mask layer on the second oxide layer;
  patterning the second oxide layer and the mask layer to expose a first part of the silicon layer; and
  subjecting the resulting structure to an anneal process thereby partially dissolving the part of the first silicon oxide layer beneath the exposed first part of the silicon layer in order to obtain a first thinned silicon oxide layer.

19. The method according to claim 18, which further comprises:
  providing a third oxide layer and another mask layer on the exposed first part of the silicon layer;
  patterning the third oxide layer and the other mask layer to expose a second part of the silicon layer; and
  subjecting the resulting structure to another anneal process thereby partially dissolving the part of the first thinned silicon oxide layer beneath the exposed second part of the silicon layer in order to obtain a second thinned silicon oxide layer.

20. The method according to claim 18, which further comprises subsequently removing the patterned second oxide layer and mask layer and subsequently providing a further oxide layer and a nitride layer over the silicon layer and providing a shallow trench isolation between a first device area comprising the part of the silicon layer that was previously covered by the patterned second oxide layer and mask layer and a second device area comprising the previously exposed first part of the silicon layer and comprising the first thinned silicon oxide layer.

* * * * *